US008216863B2

(12) United States Patent
Kirk et al.

(10) Patent No.: US 8,216,863 B2
(45) Date of Patent: Jul. 10, 2012

(54) METHOD FOR PRODUCING A FIELD-EMITTER ARRAY WITH CONTROLLED APEX SHARPNESS

(75) Inventors: Eugenie Kirk, Suhr (CH); Soichiro Tsujino, Brugg (CH)

(73) Assignee: Paul Scherrer Insitut, Villigen PSI (CH)

( * ) Notice: Subject to any disclaimer, the term of this patent is extended or adjusted under 35 U.S.C. 154(b) by 0 days.

(21) Appl. No.: 13/001,449

(22) PCT Filed: May 29, 2009

(86) PCT No.: PCT/EP2009/056595
§ 371 (c)(1),
(2), (4) Date: Dec. 27, 2010

(87) PCT Pub. No.: WO2009/156242
PCT Pub. Date: Dec. 30, 2009

(65) Prior Publication Data
US 2011/0104832 A1 May 5, 2011

(30) Foreign Application Priority Data
Jun. 27, 2008 (EP) .................................... 08011691

(51) Int. Cl.
*H01L 21/00* (2006.01)
*H01L 21/331* (2006.01)

(52) U.S. Cl. ............ 438/20; 438/338; 438/342; 257/24; 257/81; 257/E21.379

(58) Field of Classification Search .................... 438/20, 438/338, 342; 257/24, 81, E21.379; 313/309, 313/336, 351; 216/11, 24, 42, 46
See application file for complete search history.

(56) References Cited

U.S. PATENT DOCUMENTS 4,307,507 A 12/1981 Gray et al.
4,604,304 A 8/1986 Faraone et al.
(Continued)

FOREIGN PATENT DOCUMENTS

DE 10236149 A1 2/2004

OTHER PUBLICATIONS

H. Uminoto et al., "Numerical Simulation of Stress-Dependent Oxide Growth at Convex and Concave Corners of Trench Structures", IEEE Electron Device Letters, vol. 10, No. 7, Jul. 1989, pp. 330-332.

(Continued)

*Primary Examiner* — Hsien Ming Lee
(74) *Attorney, Agent, or Firm* — Laurence A. Greenberg; Werner H. Stemer; Ralph E. Locher

(57) ABSTRACT

A method of manufacturing field-emitter arrays by a molding technique includes uniformly controlling a shape of mold holes to obtain field emitter tips having diameters below 100 nm and blunted side edges. Repeated oxidation and etching of a mold substrate formed of single-crystal semiconductor mold wafers is carried out, wherein the mold holes for individual emitters are fabricated by utilizing the crystal orientation dependence of the etching rate.

7 Claims, 2 Drawing Sheets

U.S. PATENT DOCUMENTS

| | | | | |
|---|---|---|---|---|
| 4,964,946 | A | 10/1990 | Gray et al. | |
| 5,141,459 | A | 8/1992 | Zimmerman | |
| 5,201,992 | A | 4/1993 | Marcus et al. | |
| 5,580,827 | A | 12/1996 | Akamine | |
| 5,827,752 | A | 10/1998 | Ju et al. | |
| 6,093,074 | A * | 7/2000 | Suzuki | 445/51 |
| 6,132,278 | A * | 10/2000 | Kang et al. | 445/14 |
| 6,227,519 | B1 | 5/2001 | Yagi et al. | |
| 7,078,249 | B2 | 7/2006 | Zhang | |
| 2005/0062389 | A1 * | 3/2005 | Davidson et al. | 313/309 |
| 2006/0084192 | A1 | 4/2006 | Zhang | |

OTHER PUBLICATIONS

M. Sokolich et al., "Field Emission from Submicron Emitter Arrays", International Electron Device Meeting, 1990, IEDM 90, Technical Digest, IEDM90-159, pp. 741-744.

M. Dehler et al., "Full scale simulation of a field-emitter arrays based electron source for free-electron lasers", J. Vac. Sci. tenol. B24(2), Mar./Apr. 2006, pp. 892-897.

W.P. Dyke et al., "Field Emission—Large Current Densities, Space Charge, and the Vacuum Arc", Physical Review, vol. 89, No. 4, Feb. 15, 1953, pp. 799-808.

* cited by examiner

METHOD FOR PRODUCING A FIELD-EMITTER ARRAY WITH CONTROLLED APEX SHARPNESS

The present invention relates to a method for producing a field-emitter structure having controlled apex sharpness.

In this specification, a method to precisely control the shape of the mold holes is described for the purpose of producing field-emitter arrays with uniform apex sharpness and blunted side ridges. The field-emitter arrays are produced by the deposition of the electron emitter material onto the mold substrates and subsequent removal of the mold substrates. The sharpness of the emitter apex and the side ridges of the emitters are controlled by precisely shaping the mold holes by the crystal orientation dependent etching of single-crystal substrates in combination with the topography-dependence of the oxidation rate.

BACKGROUND OF THE INVENTION

1. Field of Invention

This invention relates to new methods of controlling the shape of the mold used for manufacturing high-current emitting field-emitter array structures.

One prior art method is described in U.S. Pat. No. 4,307,507 issued Dec. 29, 1981 to Gray et al. This patent describes a method of manufacturing field-emitter array structures by using pyramidal-shaped mold holes, formed by lithography and crystal-orientation dependent etching on a single-crystal semiconductor wafer, with an optional passivation layer, such as a thermal $SiO_2$ layer, a $Si_3N_4$ layer, or a metal layer, typically 30 Angstrom thick. The field-emitter array structures are formed by the deposition of the electron emitter material onto the mold wafer and the subsequent removal of the mold wafer. In this way, pyramidal-shaped electron emitter arrays with sharp emitter apex are obtained. However, in this method, the sharpness of the emitter apex fabricated by a mold without a passivation layer, or by a mold with an insufficiently thick passivation layer, is often degraded during the wafer removing process. When a sufficiently thick thermal $SiO_2$ layer is used on a Si wafer as described by a prior art in U.S. Pat. No. 5,580,827 issued Dec. 3, 1996 to Akamine, the fast oxidation rate of the side facets of the pyramidal-shaped mold compared to the slow oxidation rate of recessed areas due to the stress dependent reduction of the oxygen diffusion rate (H. Umimoto, S. Odanaka, and I. Nakao, Numerical Simulation of Stress-Dependent Oxide Growth at Convex and Concave Corners of Trench Structures, IEEE Electron Device Letters, Vol. 10, No. 7, July 1989, pp. 330) results in several undesirable consequences such as;

1) The field-emitter apex becomes extremely sharp and the resultant narrow electron emitting area at the emitter apex cannot sustain the high currents required from the individual emitters for certain applications.
2) The side ridges of the pyramidal shaped field-emitters become extremely sharp, which leads to parasitic electron emission. The electron emission from the side ridges is undesirable in particular for the field-emission performance of arrays with additional gate electrodes fabricated e.g. following the prior art method described by Sokolich et al. (M. Sokolich, E. A. Adler, R. T. Longo, D. M. Goebel, R. T. Benton, *Field emission from submicron emitter arrays*, International Electron Device Meeting, 1990. IEDM '90. Technical Digest, IEDM90-159). For example, field-emitted electrons from the side ridges are likely to bombard the gate electrodes, which results in the premature failure of the device at low current level.
3) The electron beam emitted from thus formed sharp side ridges degrades the emittance of the beam directly due to its low symmetry and indirectly due to the space-charge effect.
4) Thus formed sharp side ridges of the pyramidal shaped field-emitter affect the topography of the insulating layers and the metallic layers to be deposited on top of the field-emitter array to manufacture gate electrodes, resulting in deformation of the shape of the gate aperture holes and undesirable degradation of the emittance of the electron beams from the individual emitters.

The importance of the optimal apex diameter for the high current can be illustrated by a following numerical example: as reported by Dyke and Trolan (W. P. Dyke and J. K. Trolan, *Field emission: large current densities, space charge, and the vacuum arc*, Phys. Rev. 89, 799-808 (1953)), the stable field-emission current is obtained when the current density is kept at most around ~$10^7$ A/$cm^2$ with the corresponding emitter apex field in the order of 50-100 MV/cm. Accordingly, when the apex diameter is 1 nm, the total emission current per emitter is at most ~300 nA. However, when the apex diameter is 100 nm, the total emission current per emitter is ~3 mA. When the apex diameter is somewhere in between the two values and ~0.2 mA/tip is realized, a field-emitter array device with 40,000 tips in 0.5 mm diameter (or array with 5 micrometer pitch) can emit total current below 10 A with the total thermal emittance below 0.1 mm mrad. Recent numerical calculation by M. Dehler et al. (M. Dehler, A. E. Candel, E. Gjonaj, *Full scale simulation of a field-emitter arrays based electron source for free electron lasers*, J. Vac. Sci. Technol. B24 (2), pp. 892-897 (2006)) has demonstrated that an electron gun using a field-emitter cathode equipped with an extraction gate and a focusing gate can indeed produce such a high quality electron beam that is applicable to construct a compact free-electron laser for sub-nanometer emission wavelength.

2. Description of the Related Art

Zimmerman (U.S. Pat. No. 5,141,459) disclosed a method to fabricate a field-emitter structure with non-sharp tip apex diameter by incompletely filling the mold holes with the sacrificial material. However, with this method, achieving uniform apex diameter is not an easy task.

Marcus et al. (U.S. Pat. No. 5,201,992) disclosed a method to manufacture a field-emitter structure made of silicon having a flat top as an intermediate step to manufacture ultra-sharp tips with apex diameter of a few nanometers. As such, the uniformity of the flat-topped emitter apex is an issue here. They disclosed a method to control the apex diameter larger than a few nanometers by first repeatedly applying oxidation to the flat-topped structure to form emitter structures having uniform but sharp apex diameters less than a few nanometers, and then applying further oxidation processing to thus formed emitter structures with sharp apex to increase the apex diameter above 2.5 nm.

B. K. Ju et al. (U.S. Pat. No. 5,827,752) disclosed a method to form mold holes with large apex diameters in a silicon substrate by first manufacturing pyramidal shaped holes by the crystal-orientation-dependent etching of a silicon (100) substrate, then oxidizing the substrate, and finally removing the silicon dioxide.

Yagi et al. (U.S. Pat. No. 6,227,519 B1) disclosed a method to control the tip-shape based on the molding method by applying a heat flowable material in the mold holes.

Österschulze et al. (DE 102 36 149 A1) disclosed a method to form mold recesses to manufacture tips with 100 nm and below by utilizing a selective etching of a thin film deposited on a pre-recessed semiconductor substrate.

BRIEF SUMMARY OF THE INVENTION

Accordingly, it is therefore an object of the present invention to fabricate uniform field-emitter array structures with controlled apex sharpness and controlled sharpness of the side ridges of the pyramidal-shaped field-emitters.

The object of the present invention is achieved by modifying the shape of the mold produced using a single-crystal semiconductor wafer by lithography and crystal-orientation dependent etching, whilst maintaining the thickness of a passivation layer on the mold to protect the electron emitting material during the substrate removal process. The field emission cathode structure is formed in the thus modified mold by coating the inside with electron emitting material, followed by removal of the mold substrate.

In particular, a method according to the present invention is presented in more detail.

The method provides a way of manufacturing a field-emitter structure with apex of desired sharpness with diameter between 1 and 100 nm and blunted side riges; comprising the steps of:

a) providing a substrate wafer (101) of a single-crystal material having a number of pyramidal shaped holes (110);

b) oxidizing the substrate wafer with the holes by thermal oxidation of the substrate wafer at least in the region of said holes in order to form an oxidized layer (103) on the surface of the regions of the substrate wafer;

c) removing the oxidized layer (103) from the substrate wafer (102) to form a pre-treated substrate wafer (104);

d) oxidizing the substrate wafer (104) with the holes by thermal oxidation of the substrate wafer at least in the region of said holes (112) in order to form an oxidized layer (106) on the surface of the regions of the substrate wafer;

e) coating the pre-treated substrate wafer with an electron emitting material to form the field-emitter structure;

f) removing the substrate wafer by chemical etching in order to excavate the field-emitter structure (FIG. 10).

Further additional features can be taken from the remaining dependent claims.

BRIEF DESCRIPTION OF THE SEVERAL VIEWS OF THE DRAWING

Preferred examples of the present invention are described hereinafter with reference to the following drawings, which depict the following.

DESCRIPTION OF THE INVENTION

The invention can be best described with reference to FIGS. 1 to 7, which depict the initial, intermediate, and final shapes of the mold.

The starting point of the invented process is a wafer substrate 101 (see FIG. 1 for cross-sectional and FIG. 2 for plan view) where pyramidal shaped holes 110 having four facets with the [111] crystal orientation are etched in the single-crystal semiconductor wafer with [001] crystal orientation. In a preferred embodiment, the holes 110 are within the range 0.5×0.5 to 3×3 $\mu m^2$ in size and the precise shape of the holes 110 is determined by the anisotropy of the crystal-orientation dependent etching rate to secure the uniformity of the holes 110.

Figure 1:
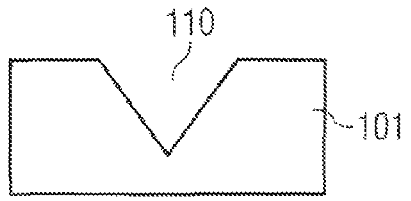
FIGS. 1 to 3 depict several of the basic preliminary steps in manufacturing substrate wafers to be used to manufacture a field emitter array structure with controlled shape in accordance with the invention, up to the stage described by Gray et al (Henry F. Gray, Richard F. Greene, Method of manufacturing a field-emission cathode structure, U.S. Pat. No. 4,307,507 issued Dec. 29, 1981) comprising a sharpened tip and side ridges.
Figure 2:
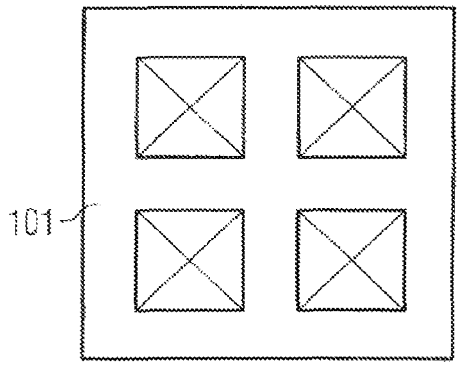
Figure 3:
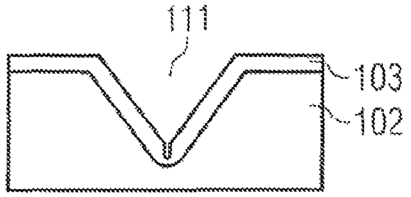
Figure 4:
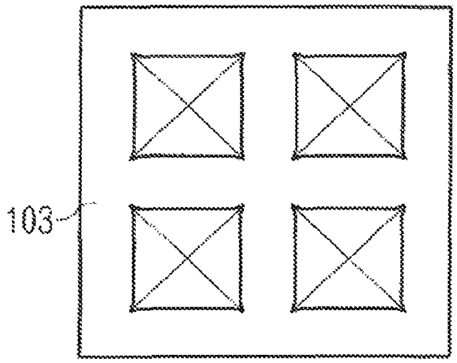
FIG. 4 depicts the top plan view of the mold resulting from the processing steps described with relation to FIGS. 1 to 3.

In the next step, a thermal oxidation process is applied to the wafer substrate 101, which forms a superficial oxide layer 103 (see FIG. 3 for cross-sectional and FIG. 4 for plan view). In a preferred embodiment, the thickness of the oxide layer 103 is chosen to be equal to 400-500 nm. Oxide growth is slower at the tips and ridges in the holes 110 of the wafer structure 101 (mold) where less oxygen is available. Consequently, the surface of the oxide becomes cusp-shaped at these junctions. On the other hand, the sharpness of the junctions is blunted at the interface between the oxide film 103 and a so-modified wafer substrate 102.

Figure 5:
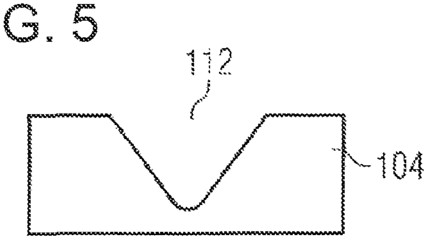
FIGS. 5 and 6 depict the final steps to manufacture a field-emitter array structure with controlled shape.

Following the thermal oxidation to form the oxide layer 103, the oxide film 103 is selectively removed and the mold wafer 104 having smooth, concave junctions at the bottom of the modified holes 112 and at the side ridges is formed (see FIG. 5 for cross-sectional view). For example, the oxide removal can be effectively achieved by wet etching using hydrofluoric acid for silicon wafers or GaAs wafers. The diameter of the bottom of the modified holes 112 typically has a radius greater than several hundred nm.

Figure 6:
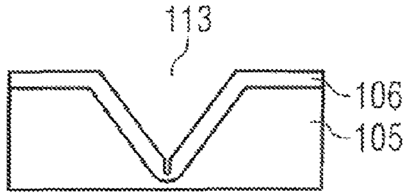
Figure 7:
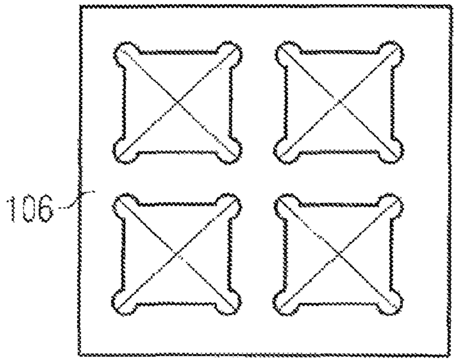
FIG. 7 depicts the top plan view of the mold resulting from the processing steps depicted in FIG. 6.
Figure 8:
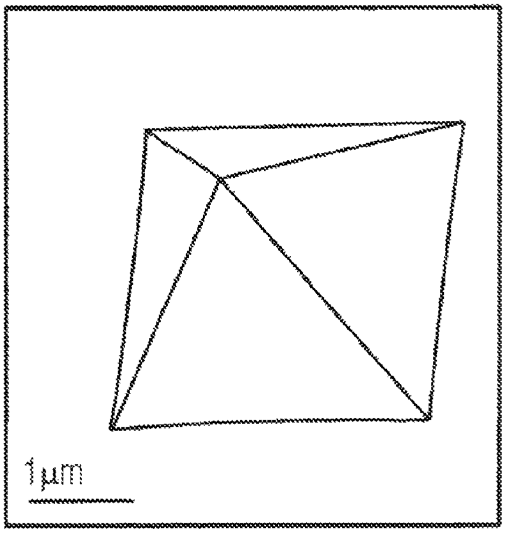
FIG. 8 shows a scanning electron microscopy image of a molybdenum field emitter structure manufactured by using a single-oxidation mold as depicted in FIGS. 3 and 4 where the present invention was not applied.

In the next step, thermal oxidation is again applied to the so-modified wafer 104, which forms another oxide layer 106 on top of the resulting wafer 105 (see FIG. 6 for cross-sectional and FIG. 7 for plan view). The oxide layer 106 also protects the electron emitter material to be deposited on top of it during the process to remove the resulting wafer substrate 105. Therefore, the thickness of the oxide layer 106 is set to be sufficiently thick in the range of 300-600 nm. In a preferred embodiment, the thickness of the oxide layer 106 is chosen to be 400 nm. As the result of topography dependent oxidation rate on the surface of the holes 112, the surface of the oxide film 106 is rounded at the junctions between the side facets and at the bottom of the holes 113.

Figure 9:
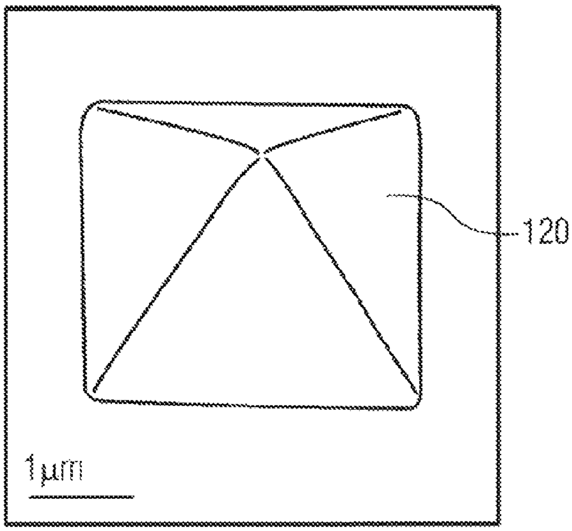
FIG. 9 shows a scanning electron microscopy image of a molybdenum field emitter structure manufactured by using a mold as depicted in FIGS. 6 and 7 where the shape of the holes is modified in accordance with the present invention.
Figure 10:
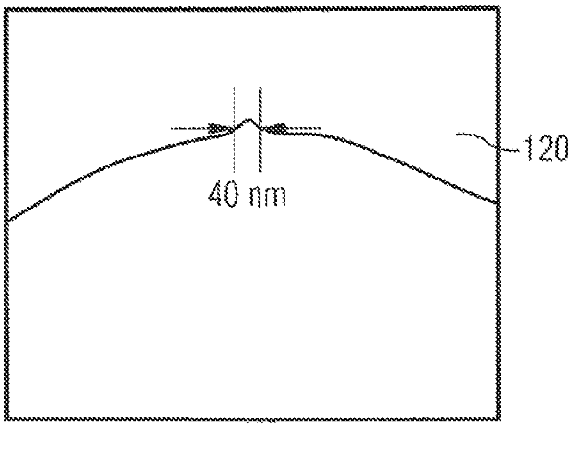
FIG. 10 shows an enlarged view of the scanning electron microscopy image of the emitter apex of a molybdenum field emitter structure manufactured by using a mold where the shape of the holes are modified in accordance with the present invention.

The field-emitter array cathode 120 is subsequently obtained by coating the mold with electron emitting layer, which is extended to sufficient thickness to sustain the resultant field-emitter array, and then by removing the resulting wafer substrate 105 and the oxide film 106 by chemical etching. The apex diameter of individual emitters is now typically in the range of tens of nanometers (see FIGS. 9 and 10) with the apex size uniformity in the range of 15%.

In the following specification of the present invention, the pertinent prior art comprises the following documentation:

References cited:

Henry F. Gray, Richard F. Greene, Method of manufacturing a field-emission cathode structure, U.S. Pat. No. 4,307,507 issued Dec. 29, 1981 .

H. Umimoto, S. Odanaka, and I. Nakao, Numerical Simulation of Stress-Dependent Oxide Growth at Convex and Concave Corners of Trench Structures, IEEE Electron Device Letters, Vol. 10, No. 7, Jul. 1989, pp.330

M. Sokolich, E. A. Adler, R. T. Longo, D. M. Goebel, R. T. Benton, Field emission from submicron emitter arrays, International Electron Device Meeting, 1990. IEDM 90. Technical Digest, IEDM90-159.

Henry F. Gray, George J. Campisi, Process for fabricating self-aligned field-emitter arrays, U.S. Pat. No. 4964946 issued Oct. 23, 1990.

Steven M. Zimmerman, Structures and processes for fabricating field emission cathodes, U.S. Pat. No. 5,141,459 issued Aug. 25, 1992.

Robert B. Marcus and Tirunelvell S. Ravi, Method for making tapered microminiature silicon structures, U.S. Pat. No. 5,201,992 issued Apr. 13, 1993 .

Shinya Akamine, Casting sharpened microminiature tips, U.S. Pat. No. 5,580,827issued Dec. 3, 1996

Byeonq Kwon Ju, Myunq Hwan Oh, Micro-tip for emitting electric field and method for fabricating the same, U.S. Pat. No. 5,827,752 issued Oct. 27, 1998.

Takayuki Yagi, Tsutomu Ikeda, Zasuhiro Shimada, Female mold substrate having a heat flowable layer, method to make the same, and method to make a microprobe tip using the female substrate, U.S. Pat. No. 6,227,519 BI issued May 8, 2001 .

Eqbert Osterschulze, Rainer Kassinq, Georqi Georqiev, Verfahren zur Herstellunq einer schmale Schneide oder Spitze aufweisenden Struktur und mit einer solchen Struktur versehener Bieqebalken, DE 102 36 149 Al issued Feb. 26, 2004.

W. P. Dyke and J. K. Trolan, Field emission : large current densities, space charge, and the vacuum arc, Phys . Rev. 89, 799-808 (1953) .

M. Dehler, A. E. Candel, E. Gjonaj, Full scale simulation of a field-emitter arrays based electron source for free electron lasers, J. Vac. Sci. Technol. B 24 (2), pp.892-897 (2006).

The invention claimed is:

1. A method of manufacturing a field-emitter structure having an apex diameter between 1 and 100 nm with blunted side ridges, comprises the following steps:

a) providing a substrate wafer of a single-crystal material having a number of pyramidal shaped holes, prepared by use of a crystal-orientation dependent etching;

b) oxidizing the substrate wafer by thermal oxidation of the substrate wafer at least in a region of the pyramidal shaped holes to form an oxidized layer at least within regions of the substrate wafer;

c) removing the oxidized layer from the substrate wafer to form a pre-treated substrate wafer;

d) oxidizing the pre-treated substrate wafer by thermal oxidation of the pre-treated substrate wafer at least in the region of the pyramidal shaped holes to form an oxidized layer at least within the regions of the pre-treated substrate wafer to form modified pyramidal shaped holes in a resulting substrate wafer;

e) coating the resulting substrate wafer with an electron emitting material to form the field-emitter structure; and f) removing the resulting substrate wafer by chemical etching to excavate the field-emitter structure.

2. The method according to claim 1, which further comprises, between step (d) and step (e), treating the resulting substrate wafer according to the following steps i) removing the oxidized layer on a surface at least in the region of the modified pyramidal shaped holes, and ii) oxidizing the resulting substrate wafer by thermal oxidation, more than once at least within the regions of the resulting substrate wafer.

3. The method according to claim 1, wherein the oxidized layer has a thickness in a range of 200 nm to 1000 nm.

4. The method according to claim 3, wherein the thickness of the oxidized layer is in a range of 400 nm to 600 nm.

5. The method according to claim 1, which further comprises using silicon as the substrate wafer material.

6. The method according to claim 1, which further comprises using silicon dioxide as an oxidized layer material.

7. The method according to claim 1, which further comprises using silicon oxynitride as an oxidized layer material.

* * * * *